(12) United States Patent
Furtaw et al.

(10) Patent No.: US 7,183,657 B2
(45) Date of Patent: Feb. 27, 2007

(54) SEMICONDUCTOR DEVICE HAVING RESIN ANTI-BLEED FEATURE

(75) Inventors: Robert John Furtaw, Frisco, TX (US);
John Henry Abbott, Missouri City, TX (US); Emily Ellen Hoffman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/947,695

(22) Filed: Sep. 23, 2004

(65) Prior Publication Data
US 2006/0060985 A1    Mar. 23, 2006

(51) Int. Cl.
*H01L 23/48* (2006.01)
*H01L 23/52* (2006.01)
*H01L 29/40* (2006.01)
*H01L 23/29* (2006.01)
*H01L 23/34* (2006.01)

(52) U.S. Cl. .............. 257/783; 257/788; 257/793; 257/724; 257/E23.04; 257/E23.18

(58) Field of Classification Search ........ 257/723–738, 257/777–795, 772, E23.04, E23.18
See application file for complete search history.

(56) References Cited

U.S. PATENT DOCUMENTS 6,291,264 B1 * 9/2001 Tang et al. ............... 438/106

* cited by examiner

*Primary Examiner*—Cuong Nguyen
(74) *Attorney, Agent, or Firm*—Yingsheng Tung; Wade James Brady, III; Frederick J. Telecky, Jr.

(57) ABSTRACT

A device and a method for controlling resin bleed, the device comprising a substrate having a surface, wherein an interior region, a peripheral region, and an exterior region of the surface are generally defined. An adhesive generally resides on the surface of the substrate in the peripheral region thereof, wherein the adhesive comprises a plurality of components, such as a metal and a resin. A first barrier is formed on the surface of the substrate generally between the adhesive and the exterior region, wherein the first barrier generally prevents one or more of the plurality of components of the adhesive from bleeding onto the exterior region of the surface of the substrate.

16 Claims, 4 Drawing Sheets

SEMICONDUCTOR DEVICE HAVING RESIN
ANTI-BLEED FEATURE

FIELD OF THE INVENTION

The present invention relates generally to semiconductor devices, and more particularly to a device for controlling a bleeding of resin on a substrate.

BACKGROUND OF THE INVENTION

In the semiconductor processing industry, various processes are performed on various substrates in order to form a multitude of various semiconductive components. For example, two or more differing components may be bonded to one another for purposes of electrical interconnection, heat dissipation, or to provide protection from environmental factors. In flip-chip semiconductor processing, for example, a conventional electronic device, such as the device 10 illustrated in FIG. 1A, comprises a flip-chip 12 that is bonded to a substrate 14, wherein the bond generally defines electrical connections (not shown) between the substrate and the flip-chip. Typically, the flip chip 12 is bonded to the substrate 14 via a plurality of solder balls, wherein the solder balls are melted in order to electrically connect and bond the substrate and the flip-chip. As illustrated in FIG. 1B, in order to dissipate heat from the bonded flip-chip 12 (shown in phantom) and/or protect the bonded flip-chip from various environmental factors, such as dust or physical contact with other external devices (not shown), a protective cap 16 is typically bonded over a flip-chip region 18, wherein the cap is bonded to the substrate via an adhesive 20.

A typical adhesive 20 is comprised of a temperature-curable bonding agent suspended in a fluid-like resin, wherein the bonding agent is typically cured by an application of heat thereto. Such a curing process generally forms the bond between the cap 16 and the substrate 14, however, the resin tends to bleed onto surrounding regions 22 of the substrate, as illustrated in FIGS. 1A and 1B. Such a bleeding of the resin has a potential to contaminate the substrate 14, the flip-chip 12, and/or various other components 24 associated with the substrate. For example, the resin that is bled onto other components 24 may form an electrically-insulative layer (not shown) over the components, wherein future electrical connections to the components may be affected by the coating of resin thereover.

Furthermore, in an instance wherein the adhesive 20 comprises an electrically-conductive bonding agent (e.g., wherein an electrical connection between the cap 16 and the substrate 14 is desired), minute portions of the electrically-conductive bonding agent can also bleed or leach out with the resin before, during, or after the curing of the adhesive. Such a bleeding of the electrically-conductive bonding agent may provide further disadvantageous results in the finished device 10, such as an electrical shorting of various circuits, capacitance bleeding, etc. For example, a bleeding of the resin over a side 26 of the substrate provides the potential for a short-circuiting of one or more connectors 28 associated with the device 10. The connectors 28, for example, may further comprise bonding pads (not shown), wherein the bonding pads are highly susceptible to resin-bleed contamination.

Conventionally, undesirable affects from resin bleed are minimized by providing a large bleed area on the substrate for the resin to bleed onto, wherein no electrical components are associated with the bleed area. However, as real estate on substrates becomes more and more valuable due to ever decreasing sizes of associated electronic devices, providing such a large area for resin bleed becomes less practical. Additionally, conventional devices used to prevent the resin bleed typically require additional processing steps, therein adding cost and/or valuable manufacturing time. Accordingly, a need exists in the art for an economical device for minimizing the negative impact of resin bleed.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward a resin-bleed control device and method for controlling a bleed of resin on a substrate, wherein conventional processing for forming other electronic devices on the substrate can further incorporate a formation of the resin-bleed control device. In accordance with one exemplary aspect of the invention, the device comprises a substrate having a surface, wherein an interior region, a peripheral region, and an exterior region of the surface are generally defined on the surface of the substrate. One or more electrical devices, such as a flip chip, are further associated with the interior region of the substrate. In order to provide heat dissipation for the one or more electrical devices and/or protect the one or more electrical devices from an external environment, a cap is bonded to the substrate. In one example, the interior region is generally isolated from the external environment by the cap.

In accordance with one aspect of the invention, the cap is bonded to one or more of the substrate and one or more electrical devices via an adhesive, wherein the adhesive is comprised of a plurality of components. For example, the adhesive generally resides on the surface of the substrate in the peripheral region, wherein the cap is further placed on the adhesive for bonding to the substrate. A first barrier is further formed over the surface of the substrate, wherein the first barrier generally resides between the adhesive and the exterior region of the surface of the substrate, wherein the first barrier generally prevents one or more of the plurality of components of the adhesive, such as a resin, from bleeding substantially onto the exterior region of the surface of the substrate.

A porosity of the first barrier, for example, is less than a porosity of one or more of the interior region and the exterior region of the surface of the substrate, wherein the porosity of the first barrier generally provides a capillary action to prevent the resin from bleeding onto the exterior region of the surface of the substrate. For example, the first barrier is comprised of a metal, wherein the porosity of the metal is substantially less than the porosity of the substrate, and wherein the resin flow is generally confined to a surface of the metal after reaching the first barrier. The first barrier, for example, is further formed on the surface of the substrate during a formation of other components associated with the device, such as a formation of bonding pads or electrical interconnects. Thus, the formation of the first barrier can be performed in a manner that does not require additional steps in processing the device, and can also increase reliability of the device without substantially increasing manufacturing costs. According to another aspect of the invention, the first barrier is formed substantially close to a side of the device, wherein minimal surface real estate is utilized to prevent bleeding of resin onto the exterior region of the substrate.

In accordance with another exemplary aspect of the invention, the device comprises a second barrier formed on the surface of the substrate, wherein the second barrier is formed within one or more of the interior region and peripheral region. Consequently, the flow of resin is generally confined between the first barrier and the second barrier. The second barrier, for example, is further formed generally concurrently to the formation of the first barrier.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
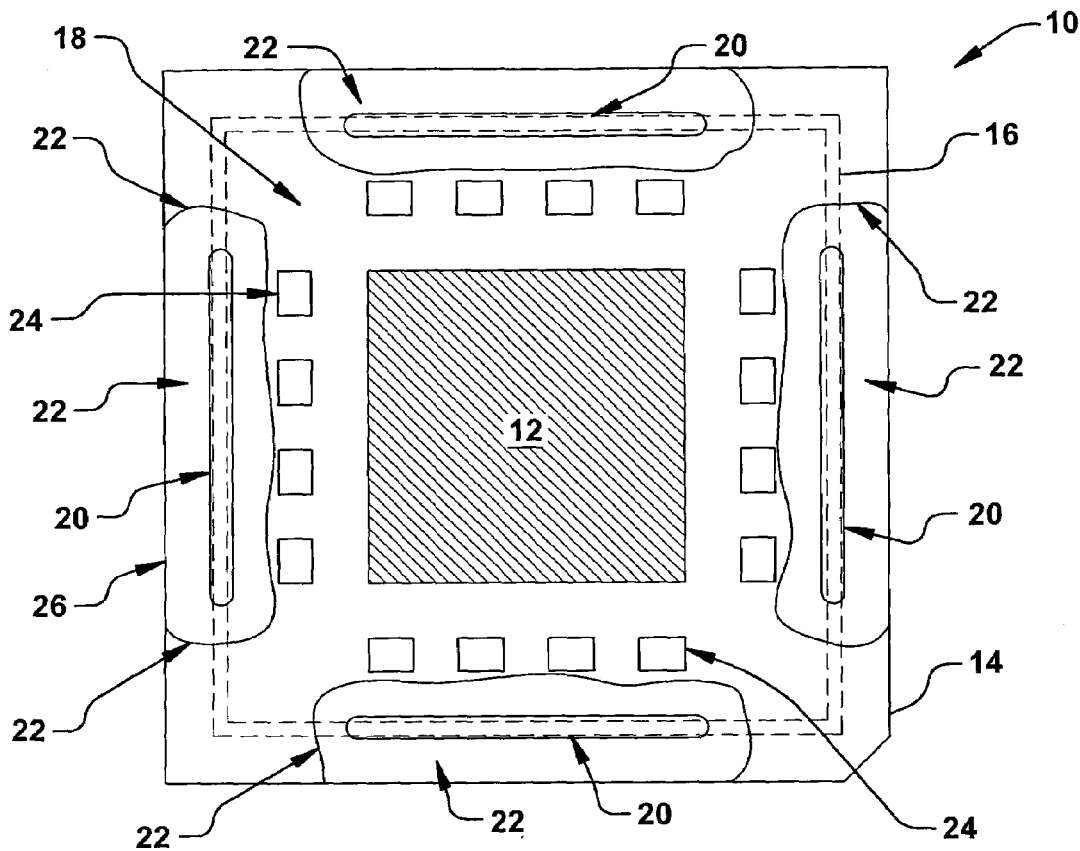
FIG. 1A is a prior art plan view of a typical substrate illustrating a bleed of resin onto the substrate.
Figure 1B:
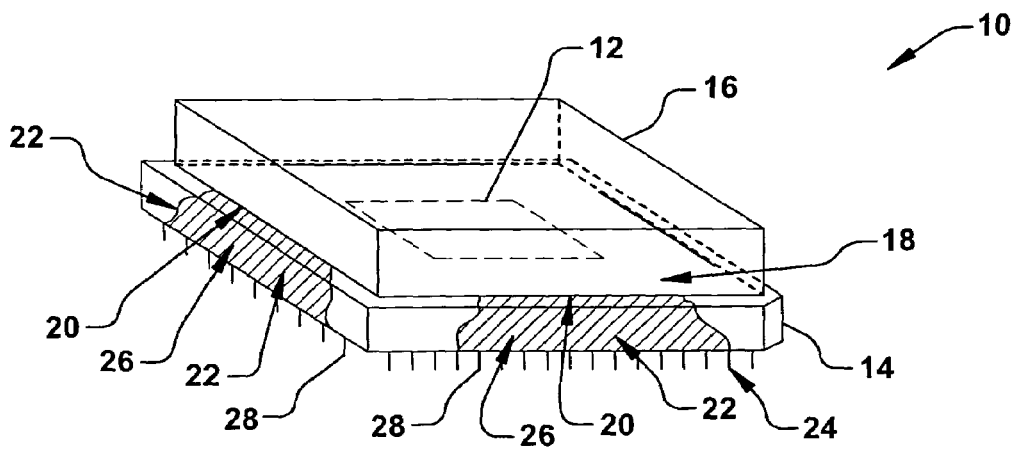
FIG. 1B is a prior art perspective view of a conventional substrate having a cap adhered thereto.

The present invention is directed towards a device for controlling a bleed of resin on a substrate. More particularly, the present invention provides a cost-effective solution for minimizing resin bleed into one or more regions of the substrate. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2A:
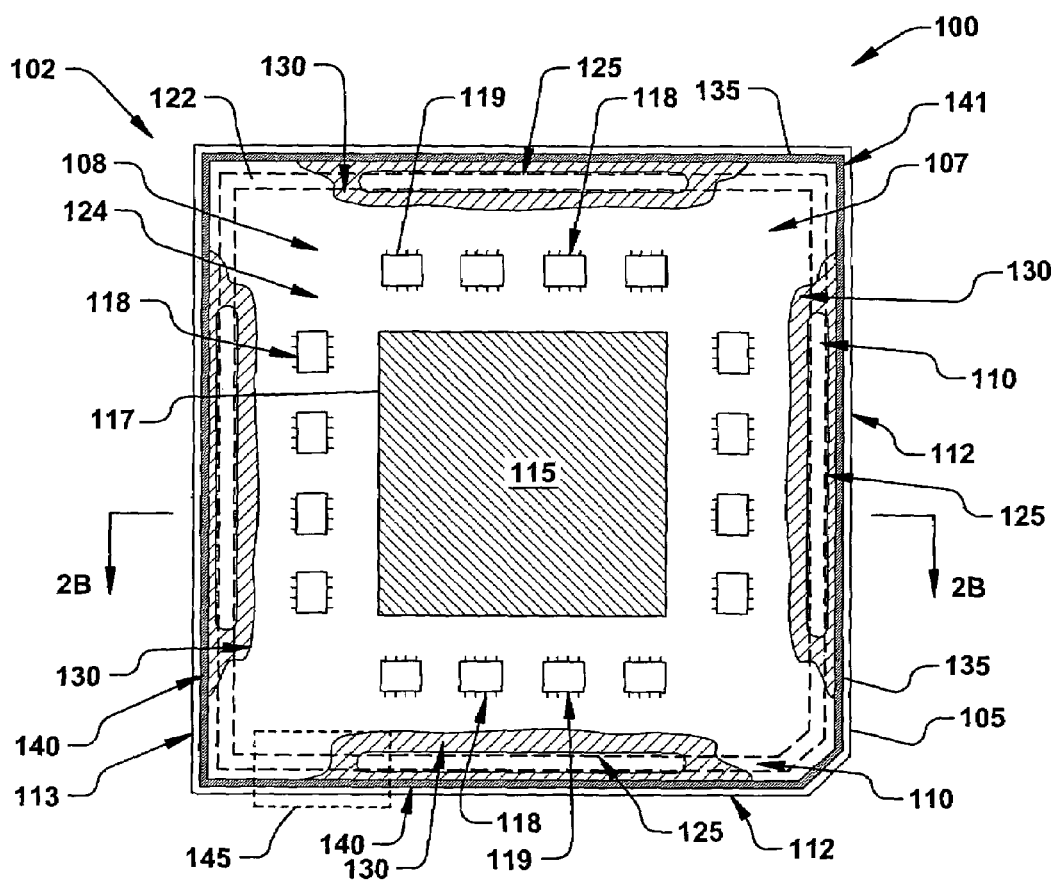
FIG. 2A is a plan view of an exemplary device for preventing resin bleed in accordance with one exemplary aspect of the present invention.

Referring now to the figures, FIG. 2A illustrates an exemplary electronic device 100, such as an integrated circuit package 102, in accordance with one aspect of the present invention. The device 100, for example, comprises a substrate 105, such as a ceramic or semiconductive substrate or carrier, wherein a surface 107 of the substrate is generally defined. An interior region 108, a peripheral region 110, and an exterior region 112 (e.g., a side surface 113) of the surface 107 are further defined, wherein an integrated circuit 115 generally resides within the interior region. The integrated circuit 115, for example, comprises a flip-chip 117 that is electrically connected to one or more contacts (not shown) associated with the substrate 105. The one or more contacts associated with the substrate 105, for example, are operable to electrically connect the integrated circuit 115 to various other devices (not shown), as will be discussed hereafter. The device 100 may further comprise various other electrical components 118, such as a plurality of capacitors 119, wherein the other electrical components further reside within the interior region 108 of the substrate. The other electrical components 118, for example, are further electrically connected to one or more of the integrated circuit 115 and other devices (not shown) associated with the device 100.

Figure 2B:
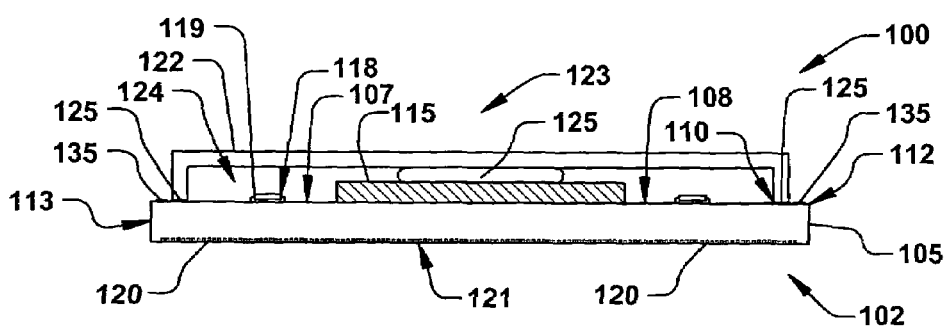
FIG. 2B is a partial cross-sectional view of the device of FIG. 2A in accordance with another exemplary aspect of the invention.

FIG. 2B illustrates a partial cross-section of the device 100 of FIG. 2A, wherein a plurality of connectors 120 are illustrated across a bottom surface 121 of the substrate 105. The plurality of connectors 120, for example, may comprise pads, sockets or pins, wherein the plurality of connectors are electrically connected to the integrated circuit 115 and various other components 118, wherein other devices (not shown) may be further electrically connected to the device 100. FIG. 2B further illustrates a cap 122 that generally resides over the interior region 108 of the substrate 105. The cap 122, for example, generally surrounds the integrated circuit 115, and is operable to protect the integrated circuit and/or other electrical components 118 (e.g., the plurality of capacitors 119) that generally reside in the interior region 108 from an external environment 123. For example, the cap 122 generally prevents dust, moisture, or the like, from entering an interior space 124 that is generally defined between the cap 122 and the interior region 108 of the surface 107 of the substrate 105.

The cap 122, for example, is comprised of a plastic, ceramic, metal, such as copper or aluminum, or a composite material such as copper tungsten or aluminum nitride. The cap 122, in one example, contacts the integrated circuit 115, wherein the cap is operable to generally dissipate heat associated with the integrated circuit 115. The cap 122 may be further associated with a heat sink (not shown), wherein the heat sink is further operable to conduct heat from the integrated circuit 115 via the cap. The cap 122, in another example, further provides protection to the integrated circuit 115 from contact with physical sources associated with the external environment 123 (e.g., the cap generally prevents objects associated with the external environment from contacting the integrated circuit 115). Alternatively, the cap 122 is operable to provide electrical shielding of the integrated circuit 115 from electrical sources associated with the external environment 123, or an electrical ground to the substrate 105. In still another alternative, the cap 122 comprises any structure, such as a spacer (not shown), or the like, wherein the cap provides a physical separation of the integrated circuit 115 from other physical sources associated with the external environment 123.

In accordance with one exemplary aspect of the invention, the cap 122 is generally affixed to the surface 107 of the substrate 105 by an adhesive 125. For example, as illustrated again in FIG. 2A, the adhesive 125 is applied to the peripheral region 110 of the surface 107 of the substrate 105, and the cap 122 is subsequently placed over the adhesive, such that the cap is substantially adhered to the substrate via the adhesive. In another example, the adhesive 125 is further applied to the integrated circuit 115, as illustrated in FIG. 2B, wherein the adhesive generally provides an advantageous thermal conductivity between the integrated circuit and the cap 122 for purposes of heat dissipation. The adhesive 125, for example, is generally comprised of a plurality of components, such as a metal in one or more binders, wherein the adhesive is curable by an application of heat thereto (e.g., at a temperature of approximately 150° C.), and wherein the cap 122 is generally bonded to the substrate 105 upon curing of the adhesive.

Again referring to FIG. 2A, the adhesive 125, for example, can comprise a resin 130 that will leech or bleed onto the surface 107 of the substrate 105 prior to curing of the adhesive. For example, over time, the resin 130 will bleed from the adhesive 125 and onto the surface 107 of the substrate 105. Furthermore, the bleed of resin 130 can carry along one or more of the plurality of components of the adhesive 125, such as the trace amounts of the metal, wherein the trace amounts of metal is further bled onto the surface 107. Such a bleed of resin 130, with or without the trace amounts of metal, can have deleterious effects on the device 100 if the bleed of resin extends onto the bottom surface 121 of the substrate and onto the plurality of contacts 120.

Therefore, in accordance with the present invention, as illustrated in FIG. 2A, a first barrier 135 is formed over the surface 107 of the substrate 105 within the peripheral region 110 in order to control the bleed of resin 130. The first barrier 135, for example, generally surrounds the interior region 108 of the substrate 105, and further generally isolates the interior region from the exterior region 112 of the substrate. According to another example, the first barrier 135 is formed substantially close to the side surface 113 of the substrate, wherein the first barrier occupies a minimal amount of surface area of the substrate. Accordingly, the first barrier 135 is operable to generally control the flow of resin 130, such that the resin is generally prevented from flowing onto the surface 107 of the substrate 105 in the exterior region 112 thereof.

According to another exemplary aspect of the invention, the first barrier 135 has a surface 140 that has a porosity that is less than a porosity of the surface 107 of the substrate 105 in one or more of the interior region 108 and the exterior region 112. For example, the first barrier 135 is comprised of a material having a porosity that is less than a porosity of the substrate 105. The first barrier 135, for example, is comprised of one or more metals such as gold, silver, nickel, copper, and titanium, wherein the one or more metals are plated (e.g., electroplated) on the surface 107 of the substrate 105. Alternatively, the first barrier 135 is formed on the surface 107 of the substrate 105 by silk-screening. The first barrier 135, for example, is formed on the substrate 105 in conjunction with a formation of other metal features (not shown) on the substrate, such as during formation of bonding pads or wiring lines associated with the electrical connection of the integrated circuit 115 to the substrate 105. According to one example, the first barrier 135 comprises silver or gold that is electroplated to a thickness of less than about one micron. Alternatively, the first barrier 135 is comprised of any material that has a porosity that is less than the porosity of the surface 107 of the substrate 105, and any thickness of the first barrier is contemplated as falling within the scope of the present invention.

Figure 3:
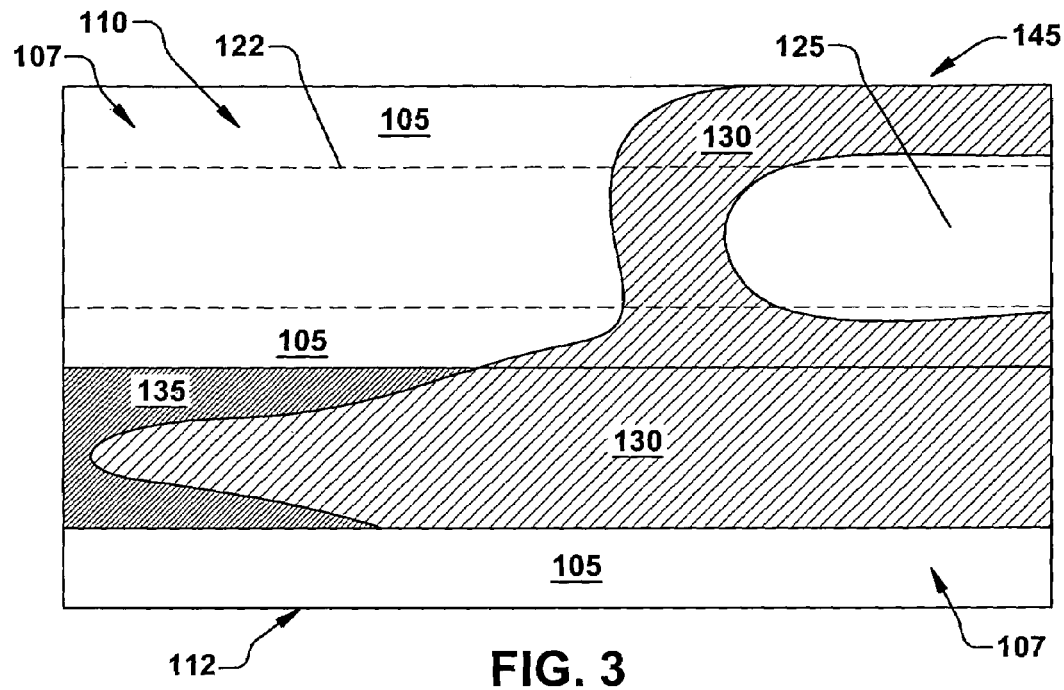
FIG. 3 is an exploded plan view of a portion of the device of FIG. 2A in accordance with yet another exemplary aspect of the present invention.

As stated above, the surface 140 of the first barrier 135 is less porous than the surface 107 of the substrate 105. Such a porosity of the surface 140 of the first barrier 135 generally provides a channeling of the bleed, or flow, of resin 130 along the smoother, less porous surface 140 of the first barrier, wherein the resin flow generally follows a path of least resistance. Furthermore, the surface 140 of the first barrier 135 is operable to provide a capillary action, wherein the resin 130 is generally pulled toward the first barrier. Accordingly, the bleed of resin 130 is controlled by the first barrier 135, wherein the surface 140 of the first barrier provides less resistance to flow than the surface 107 of the substrate 105. FIG. 3 illustrates an exploded view 145 of the device 100 of FIG. 2A, wherein the resin bleed 130 flows from the adhesive 125 onto the surface 107 of the substrate 105. Upon encountering the first barrier 135, the resin 130 is generally channeled along the surface 140 of the first barrier. It is believed that the flow of resin 130 is generally controlled by capillary and/or other forces associated with the surface 140 of the first barrier 135, since the surface 140 is less porous than the surface 107 of the substrate 105.

Again, since the surface 107 of the substrate 105 in the external region 112 has a greater porosity than the surface 140 of the first barrier 135, the resin 130 is generally deterred from bleeding into the external region after bleeding onto the first barrier. Therefore, the bleed of resin 130 is controlled still further, wherein the resin is generally prevented from bleeding into the external region 112 and bottom surface 121 of the substrate 105, thus preventing a bleed of resin onto the plurality of connectors 120. Such a control of the flow or bleed of resin 130, for example, is highly advantageous if any electrically conductive components of the adhesive 125 are also carried or bled with the resin during its flow. Consequently, since the flow of resin 130 is generally controlled by the first barrier, electrically conductive or insulative components associated with the adhesive 125 are substantially prevented from contacting the connectors 120, and thus providing a more reliable device 100.

In accordance with one example, the first barrier 135 comprises a ring 141 formed on the surface 107 of the substrate 105 within the peripheral region 110, wherein the first barrier generally surrounds the interior region 108, thus limiting the resin bleed 130 to within the interior region 108. Alternatively, the first barrier 135 comprises a plurality of barriers (not shown) formed in the peripheral region 110 of the surface 107 of the substrate 105, wherein each barrier controls a particular portion of resin bleed 130 from bleeding into the exterior region 112. Accordingly, the present invention contemplates any configuration of the first barrier 135, wherein the first barrier generally controls the resin bleed 130 from flowing into the exterior region 112 of the substrate 105.

Figure 4:
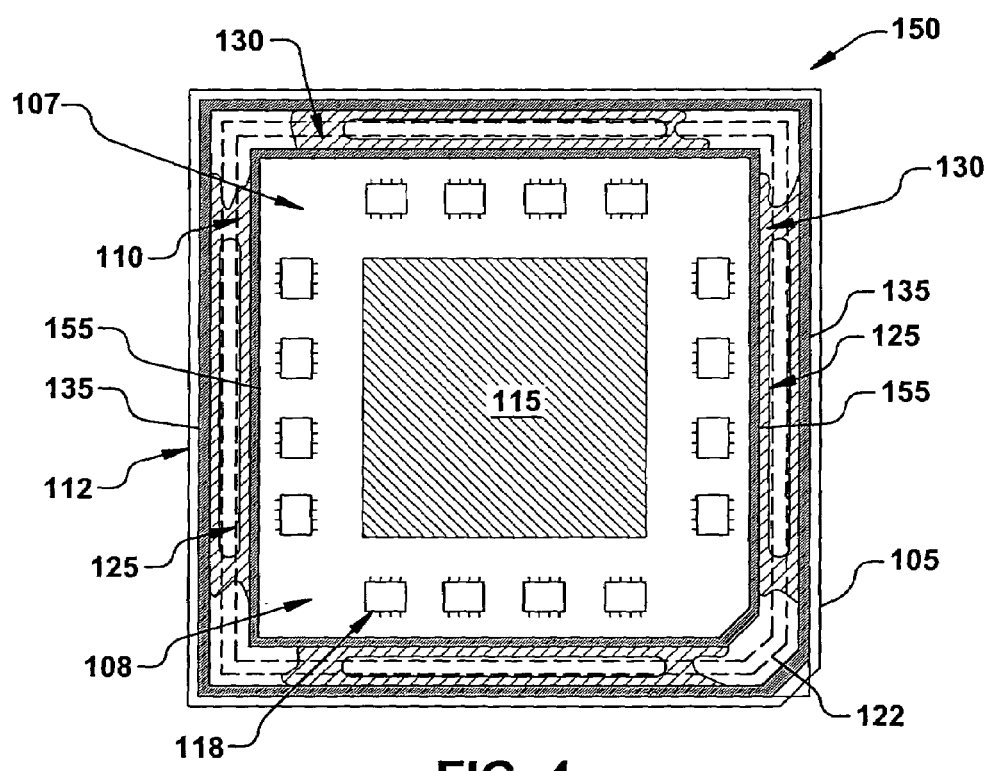
FIG. 4 is a plan view of another exemplary device for preventing resin bleed according to still another exemplary aspect of the present invention.

In accordance with another exemplary aspect of the present invention, FIG. 4 illustrates another exemplary device 150, wherein a second barrier 155 is formed over the surface 107 of the substrate 105. The second barrier 155, for example, can be formed in a manner similar to the formation of the first barrier 135, and may be comprised of a similar material (e.g., a metal). Again, like the first barrier 135 discussed above, the second barrier 155 has a surface 157 that has a porosity that is less than the porosity of the surface 107 of the substrate 105. Consequently, the second barrier 155 can further control the bleed of resin 130. For example, the second barrier 155 is formed on the surface 107 in one or more the interior region 108 and peripheral region 110 of the substrate 105, wherein the bleed of resin 130 is generally confined between the first barrier 135 and the second barrier 155. It should be noted that further barriers (not shown) can be formed on the substrate 105 in accordance with the present invention (e.g., between the integrated circuit 115 and the various other electrical components 118), wherein the further barriers provide a further control of resin bleed on the substrate, and such further barriers are contemplated as falling within the scope of the present invention.

Figure 5:
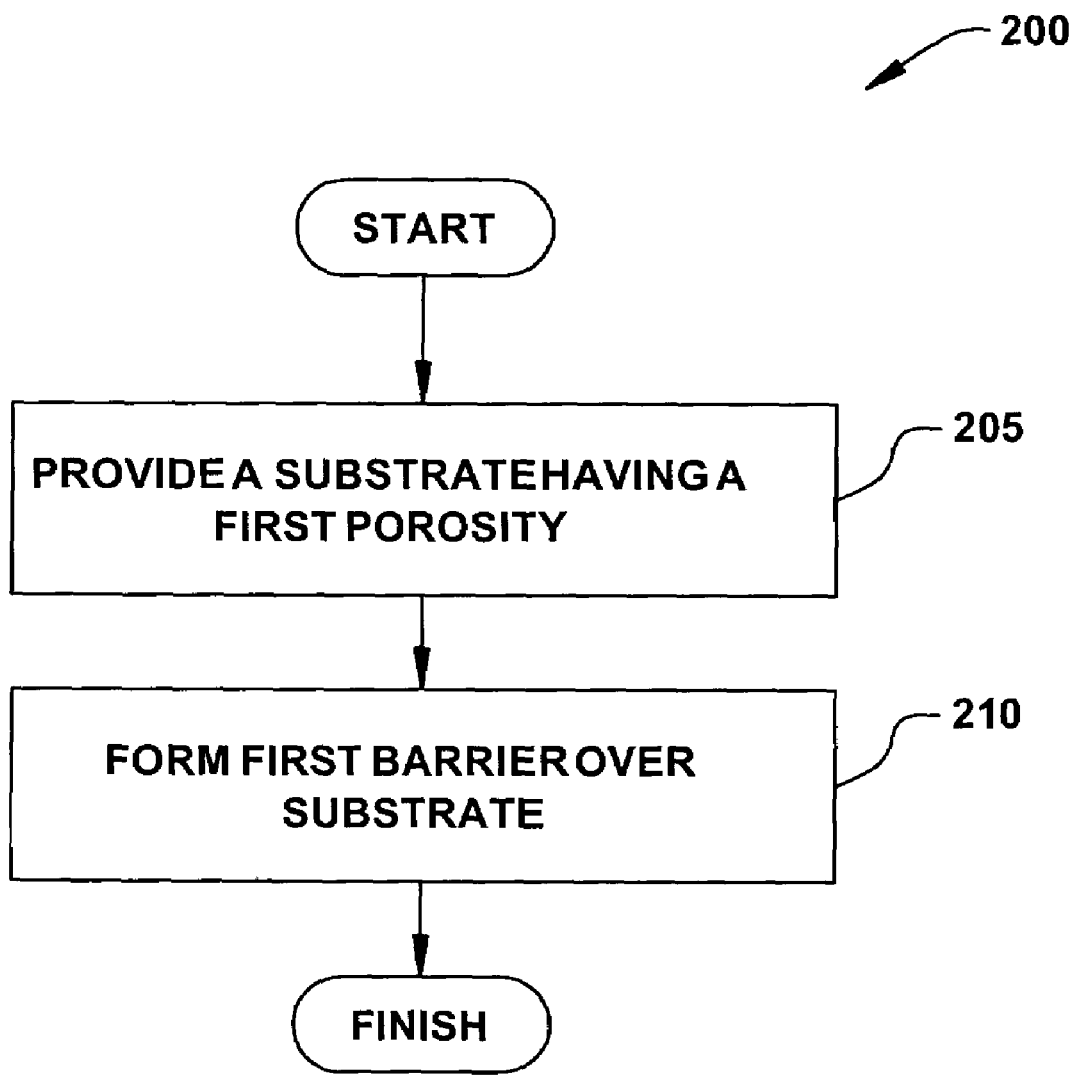
FIG. 5 is a block diagram of an exemplary method for controlling a resin-bleed on a substrate in accordance with another aspect of the present invention.

According to still another exemplary aspect of the present invention, FIG. 5 is a schematic block diagram illustrating an exemplary method 200 for controlling a bleed of resin on a substrate. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 5, the method 200 begins with act 205, wherein a substrate, such as a ceramic substrate, is provided, wherein the substrate has a first surface having a first porosity associated therewith. In accordance with one exemplary aspect of the invention, one or more regions of the first surface are generally defined, wherein an adhesive is operable to be applied to the first surface within one or more regions in order to secure a cap thereto. The adhesive, for example, is comprised of a suspension of metal in a resin, wherein the adhesive is operable to be cured by an application of heat thereto. Furthermore, the resin is operable to bleed or flow from the adhesive onto the first surface In act 210, a first barrier is formed over the first surface of the substrate, wherein the first barrier generally defines a second surface having a second porosity. In accordance with the present invention, the second porosity of the first barrier is less than the first porosity of the substrate. The first barrier, for example, is formed via electroplating a metal onto the first surface of the substrate, wherein the first barrier generally surrounds the one or more regions of the first surface. Since the second porosity of the first barrier is less than the first porosity of the substrate, the second surface is operable to generally provide a capillary effect for any resin that may bleed onto the second surface. Such a capillary action further generally prevents the bleed of resin outside of the one or more regions, therein generally controlling the bleed of resin.

Furthermore, since the resin will follow the path of least resistance upon bleeding of the adhesive (e.g., prior to curing of the adhesive), the resin will flow via capillary action on the second surface, but will not substantially flow from the second surface back onto the first surface, because the second porosity of the first barrier is less than the first porosity of the substrate.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A device for controlling resin bleed in an integrated circuit package, the device comprising:
    a substrate having a surface, wherein an interior region, a peripheral region, and an exterior region of the surface are generally defined;
    an integrated circuit associated with the interior region of the surface of the substrate;
    an adhesive comprising a plurality of components, wherein the adhesive generally resides on the surface of the substrate in the peripheral region thereof, and wherein the adhesive is operable to substantially bond a cap to the substrate; and
    a first barrier formed over the surface of the substrate, wherein the first barrier generally resides between the adhesive and the exterior region, and wherein the first barrier generally prevents one or more of the plurality of components associated with the adhesive from bleeding onto the exterior region of the surface of the substrate.

2. The device of claim 1, wherein a surface of the first barrier has a porosity that is less than a porosity of one or more of the interior region and the exterior region.

3. The device of claim 2, wherein the first barrier is comprised of a material having a porosity that is less than a porosity of the substrate.

4. The device of claim 3, wherein the material is comprised of one or more of a metal and a metal alloy.

5. The device of claim 4, wherein the metal comprises one or more gold, silver, nickel, copper, and titanium.

6. The device of claim 4, wherein the material is electroplated onto the surface of the substrate.

7. The device of claim 4, wherein the material is silk-screened onto the surface of the substrate.

8. The device of claim 3, wherein the first barrier provides an electrical connection to an electrical ground.

9. The device of claim 1, wherein the first barrier has a thickness extending in a direction generally perpendicular to the surface of the substrate, wherein the thickness is less than approximately one micron.

10. The device of claim 1, further comprising a second barrier formed on the surface within one or more of the interior region and peripheral region, wherein the resin is generally contained between the first barrier and the second barrier.

11. The device of claim 10, wherein the first barrier and the second barrier are comprised of the same material.

12. The device of claim 1, wherein the first barrier comprises a ring, wherein an interior portion of the ring encompasses the interior region of the substrate.

13. The device of claim 1, wherein the cap generally surrounds the integrated circuit, therein generally protecting the integrated circuit from an external environment.

14. The device of claim 1, wherein the first barrier is formed near an edge of the substrate.

15. The device of claim 1, wherein at least one of the one or more components comprises a resin.

16. The device of claim 1, wherein the substrate is comprised of a ceramic.

* * * * *